United States Patent [19]

Sinta et al.

[11] Patent Number: 5,362,600

[45] Date of Patent: * Nov. 8, 1994

[54] RADIATION SENSITIVE COMPOSITIONS COMPRISING POLYMER HAVING ACID LABILE GROUPS

[75] Inventors: Roger Sinta, Woburn; Richard C. Hemond, Brighton; David R. Medeiros, Cambridge; Martha M. Rajaratnam, Dedham; James W. Thackeray, Braintree; Dianne Canistro, Lancaster, all of Mass.

[73] Assignee: Shipley Company Inc., Marlborough, Mass.

[*] Notice: The portion of the term of this patent subsequent to Nov. 2, 2010 has been disclaimed.

[21] Appl. No.: 78,654

[22] Filed: May 25, 1993

Related U.S. Application Data

[63] Continuation of Ser. No. 763,827, Sep. 23, 1991, Pat. No. 5,258,257.

[51] Int. Cl.⁵ ............................ G03C 1/54; G03C 5/58
[52] U.S. Cl. .................................... 430/192; 430/193; 430/313; 430/905; 430/909
[58] Field of Search ............... 430/192, 193, 313, 905, 430/909

[56] References Cited

U.S. PATENT DOCUMENTS

| | | |
|---|---|---|
| 4,491,628 | 1/1985 | Ito et al. ............... 430/176 |
| 4,810,613 | 3/1989 | Osuch et al. ........... 430/192 |
| 4,883,740 | 11/1989 | Schwalm et al. ........ 430/270 |
| 4,931,379 | 6/1990 | Brunsvold et al. ...... 430/270 |
| 4,939,070 | 7/1990 | Brunsvold et al. ...... 430/312 |
| 4,948,697 | 7/1990 | Durham ............... 430/165 |
| 4,968,581 | 11/1990 | Wu et al. ............. 430/192 |
| 4,996,136 | 2/1991 | Houlihan et al. ....... 430/313 |
| 5,075,199 | 12/1991 | Schwalm et al. ........ 430/281 |
| 5,128,232 | 7/1992 | Thackeray et al. ...... 430/192 |
| 5,210,000 | 5/1993 | Thackeray ............ 430/192 |
| 5,258,257 | 11/1993 | Sinta et al. .......... 430/192 |

FOREIGN PATENT DOCUMENTS

| | | |
|---|---|---|
| 2001284 | 4/1990 | Canada . |
| 0102450 | 3/1984 | European Pat. Off. . |
| 0419147 | 3/1984 | European Pat. Off. . |
| 0440374 | 8/1991 | European Pat. Off. . |

*Primary Examiner*—Charles L. Bowers, Jr.
*Assistant Examiner*—Mark F. Huff
*Attorney, Agent, or Firm*—Robert L. Goldberg; Peter F. Corless

[57] ABSTRACT

The invention provides a radiation sensitive composition having a polymer binder of phenolic and cyclic alcohol units. At least a portion of the phenolic units and/or cyclic alcohol units of the polymer are bonded to acid labile groups. High solubility differentials between exposed and unexposed regions are realized with only moderate substitution of the binder with the acid labile groups.

19 Claims, No Drawings

RADIATION SENSITIVE COMPOSITIONS COMPRISING POLYMER HAVING ACID LABILE GROUPS

This is a continuation of copending application Ser. No. 07/763,827 filed on Sept. 23 1991, now U.S. Pat. No. 5,258,257.

BACKGROUND OF THE INVENTION

1. Field of the Invention

This invention relates to radiation sensitive compositions such as photoresists that provide high solubility differentials between exposed and unexposed regions, and increased transparency to activating radiation.

2. Background Art

Photoresists are photosensitive films used for transfer of an image to a substrate. They may be negative or positive acting. After a coating of a photoresist is formed on a substrate, the coating is selectively exposed through a photomask to a source of activating energy such as ultraviolet light. The photomask has areas that are opaque to activating radiation and other areas that are transparent to activating radiation. The pattern in the photomask of opaque and transparent areas define a desired image to be transferred to a substrate.

In the case of a negative photoresist, exposed portions of a photoresist coating become less soluble in a developer as the result of a photochemical reaction, thereby resulting in differential solubility between the exposed and unexposed portions. This difference in solubility allows for the selective removal of unexposed portions of the photoresist coating and the subsequent transfer of an image to a substrate.

In the case of a positive acting photoresist, exposed portions of the photoresist coating become more soluble in developer than unexposed portions as the result of a photochemical reaction allowing for selective removal of exposed areas by development.

Following development of a photoresist coating, portions of the substrate bared by development may be altered such as by etching. The historical background, types and processing of conventional photoresists are described by Deforest, *Photoresist Materials and Processes*, McGraw Hill Book Company, New York, Chapter 2, 1975 and by Moreau, *Semiconductor Lithography, Principles, Practices and Materials*, Plenum Press, New York, Chapters 2 and 4, 1988, both incorporated herein for their teaching of photoresist compositions and methods of making and using the same.

Most commercial photoresist formulations, both positive and negative, comprise a film forming binder and a radiation sensitive component. Many of these film forming binders are phenolic resins. For example, many positive acting photoresists currently in commercial use comprise a novolak resin and a naphthoquinone diazide sulfonic acid ester photoactive compound where the novolak resin is the reaction product of formaldehyde and a phenol. Examples of such photoresists are disclosed in U.S. Pat. Nos. 4,377,631 and 4,404,272 incorporated herein by reference. Another class of positive acting photoresists comprise a poly(vinylphenol) and a naphthoquinone diazide sulfonic acid ester. Examples of these photoresists are disclosed in U.S. Pat. Nos. 3,869,292 and 4,439,516, both incorporated herein by reference.

An important property of a photoresist is image resolution. A developed image of fine line definition having vertical side-walls is highly desired to permit transfer of the fine line image to an underlying substrate.

Another important property of a photoresist is photospeed. Photospeed is a common way of describing the sensitivity of a photoresist or other radiation sensitive compositions to activating radiation. Enhanced photospeed is especially important in applications where a number of exposures are needed, for example, in generating multiple patterns by a step and repeat process, or where activating energy of reduced intensity is employed. Increased photospeed also permits reduction in the radiation sensitive component of the photoresist and/or a decrease in the required energy of exposure for image formation.

Some cationic photoinitiators have been used to induce selective photogenerated acidic cleavage of certain "blocking" groups pendant from a photoresist binder, or cleavage of certain blocking groups that comprise a photoresist binder. See, for example, U.S. Pat. Nos. 4,968,581; 4,883,740; 4,810,613 and 4,491,628, and Canadian Patent Application 2,001,384, all of which are incorporated herein by reference for their teaching of the described binders and acid labile blocking groups, and methods of making and using the same. Such cleavage is reported to create different solubility characteristics in exposed and unexposed areas of the polymer. Upon selective cleavage of the blocking group through exposure of the photoresist, a polar functional group is said to be provided, for example, carboxyl or imide.

It has been found that these reported systems have limitations. For example, to realize significant solubility differentials between exposed and unexposed regions (and thereby provide high resolution of the developed image), known systems generally require that a somewhat large portion of the photoresist binder contain acid labile blocking groups. That is, a large portion of the polar functionalities of the resist are substituted with blocking groups so that a sufficient solubility differential is provided between exposed and unexposed regions of the resist. Consequently, exposure results in cleavage of a significant mass of the resist. This can result in shrinkage of the photoresist in exposed regions and thereby compromise resolution of the image patterned in the photoresist coating layer.

Other problems can arise upon subsequent etching of the substrate that underlies the developed photoresist image. For example, to etch an aluminum or silicon oxide substrate rather stringent conditions are often employed. Aluminum chlorine gas is frequently used to etch such substrates and extensive localized heating often occurs during the etching sequence. As a consequence, the patterned photoresist coating on the substrate can experience shrinkage as the acid labile groups of the unexposed resist pattern undergo thermally induced cleavage. This can result in the imaged photoresist lines having a wrinkled or roughened surface, a condition known in the art as reticulation and which can be undesirable, particularly for high resolution applications.

In U.S. Pat. No. 5,128,232, incorporated herein by reference, a photoresist composition is described, the composition having a resin binder comprising a polymer having a major portion of phenolic units and a minor portion of cyclic alcohol units. This application discloses that by employing cyclic alcohol units in the binder, the resist composition exhibits enhanced transparency to activating radiation. This application also discloses that the concentration of the cyclic alcohol units should be limited to retain developer solubility of an exposed layer of the resist composition.

It would be desirable to have a photoresist binder that could provide high solubility differentials upon exposure with only a moderate substitution of the binder with acid labile groups. It also would be desirable to have a photoresist binder that contained acid labile groups but was resistant to reticulation during stringent processing steps. It would be further desirable to have a radiation sensitive composition that was highly transparent to activating radiation.

SUMMARY OF THE INVENTION

The present invention provides a radiation sensitive composition that comprises a resin binder that comprises a polymer having pendant acid labile blocking groups and a radiation sensitive component that generates acid upon exposure to activating radiation. The polymer comprises both phenolic and cyclic alcohol units.

It has been discovered that high solubility differentials between exposed and unexposed regions of a coating layer of the composition of the invention are realized with only modest levels of substitution of the binder with acid labile blocking groups, including where about 1 percent of the hydroxyl groups of the polymer are blocked with acid labile groups. Preferably from about 5 to 35 percent of the hydroxyl groups of the binder are blocked with acid labile groups. This is in contrast to prior systems where significantly greater portions of available polar groups of the binder are substituted with blocking groups. High solubility differentials between exposed and unexposed regions, with relatively low levels of blocking group substitution are possible because the cyclic alcohol units of the binder are less polar relative to the phenolic groups, effectively limiting solubility of unexposed regions in aqueous alkaline developers, but enabling high solubility of those regions in suitable organic developers. Thus, a radiation sensitive composition is provided where a comparatively smaller mass of blocking groups is liberated upon photoinduced cleavage, thereby avoiding problems of prior systems such as shrinkage of the composition layer.

Reticulation of patterned resist lines that can arise during post-exposure processing steps such as substrate etching is also generally avoided by use of the composition of the invention. By providing a binder having a relatively small mole percent of acid labile groups, thermally induced cleavage can only liberate a relatively smaller mass of acid labile groups, thus reducing reticulation of the patterned resist.

It has been further discovered that by employing suitable blocking groups, a phenol-containing polymer binder comprising a high concentration of cyclic alcohol units may be employed. This is accomplished by the highly polar groups that can be grafted onto the binder by the sequential steps of blocking at least a portion of the binder's hydroxyl units, followed by photocleavage of the blocking groups. For example, photocleavage of a t-butyl acetate acid labile group provides the acetic acid ether moiety (—OCH$_2$COOH). Such polar groups render exposed regions soluble in a polar developer where the polymer has a cyclic alcohol concentration of 50 mole percent or greater, including concentrations of cyclic alcohol units in the polymer 60 mole percent or greater of the total polymer, and even concentrations of cyclic alcohol units in the polymer of 70 mole percent or greater of the total polymer. By utilizing such a polymer binder that has a high mole percent of cyclic alcohol units, a radiation sensitive composition is provided that exhibits exceptional optical clarity, i.e., decreased radiation absorption during exposure of the composition to activating radiation. Consequently, the radiation sensitive composition has increased photospeed.

The radiation sensitive compositions of the invention can be either positive acting or negative acting. The high solubility differentials discussed above enable selective removal of exposed regions of a film of the composition with an aqueous alkaline solution, and selective removal of unexposed regions with suitable organic developers.

The radiation sensitive compositions of the invention may additionally comprise dissolution inhibiting compounds to further control dissolution of an exposed coating layer of the composition. The compositions may also comprise sensitizer compounds to expand the spectral sensitivity of the composition.

Various methods may be used to form the polymer of the phenol and cyclic alcohol units. One method comprises copolymerizing a cyclic alcohol with phenol. A preferred method involves hydrogenation of a preformed phenolic resin. The acid labile groups are then grafted onto to the reactive hydroxyl sites of the polymer, typically by a base-catalyzed condensation reaction.

It should be appreciated that by using a polymer of a cyclic alcohol and a phenol in place of a phenolic polymer in the formulation of a radiation sensitive composition, less energy is absorbed by the binder during exposure and therefore, given a constant exposure energy, more energy is available for activation of the radiation sensitive component of the composition. The improvements resulting from the use of the binder polymer of a cyclic alcohol and a phenol will vary for differing compositions dependent upon the energy required for activation. For example, it is known that the greatest absorption by a conjugated bond is within the deep UV range. Therefore, use of the polymer binder described herein as a binder for a composition activated by deep UV radiation (i.e, radiation having a wavelength of from about 100 to 300 nm) exposure can be more efficacious than the use of the same polymer in a composition activated at an exposure energy other than deep UV.

The use of the polymer binder described herein in a radiation sensitive composition results in increased photospeed. In addition, it has been found that radiation sensitive compositions using the subject polymer exhibit improved image resolution following development. Relief images formed using compositions of the invention are capable of fine line resolution (including images of submicron widths) and possess vertical side walls known by the art to be highly desirable for transfer of fine line images to underlying substrates.

The present invention also provides processes for the production of relief patterns and relief images using the described radiation sensitive compositions, and related articles of manufacture.

DETAILED DESCRIPTION OF THE INVENTION

The polymer binder of the invention comprises phenolic and cyclic alcohol units. The preferred polymers for purposes of this invention are those formed by the hydrogenation of a phenol formaldehyde (novolak) or a poly(vinylphenol) resin.

Procedures for the preparation of conventional novolak and poly(vinylphenol) resins used as photoresists binders are well known in the art and disclosed in numerous publications including those discussed above. Novolak resins are the thermoplastic condensation products of a phenol and an aldehyde. Examples of suitable phenols for condensation with an aldehyde, especially formaldehyde, for the formation of novolak resins include phenol; m-cresol; o-cresol; p-cresol; 2,4-xylenol; 2,5-xylenol; 3,4-xylenol; 3,5-xylenol and thymol. An acid catalyzed condensation reaction results in the formation of a suitable novolak resin which may vary in molecular weight from about 500 to 100,000 daltons. The preferred novolak resins conventionally used for the formation of photoresists are the cresol formaldehyde condensation products.

Poly(vinylphenol) resins are thermoplastic polymers that may be formed by block polymerization, emulsion polymerization or solution polymerization of the corresponding monomers in the presence of a cationic catalyst. Vinylphenols useful for the production of poly(vinylphenol) resins may be prepared, for example, by hydrolysis of commercially available coumarin or substituted coumarins, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or non-substituted hydroxybenzaldehydes with malonic acid. Preferred poly(vinylphenol) resins prepared from such vinylphenols have a molecular weight range of from about 2,000 to about 100,000 daltons.

As noted, preferred resins for purposes of this invention are polymers of phenols and nonaromatic cyclic alcohols analogous in structure to the novolak resins and poly(vinylphenol) resins. These polymers may be formed in several ways. For example, in the conventional preparation of a polyvinyl phenol resin, a cyclic alcohol may be added to the reaction mixture as a comonomer during polymerization reaction which is thereafter carried out in normal manner. The cyclic alcohol is preferably aliphatic, but may contain one or two double bonds. The cyclic alcohol is preferably one closest in structure to the phenol. For example, if the resin is a polyvinyl phenol, the comonomer would be vinyl cyclohexanol.

The preferred method for formation of the polymer comprises partial hydrogenation of a preformed novolak resin or a preformed polyvinyl phenol resin. Hydrogenation may be carried out using art recognized hydrogenation procedures, for example, by passing a solution of the phenolic resin over a reducing catalyst such as a platinum or palladium coated carbon substrate or preferably over Raney nickel at elevated temperature and pressure. The specific conditions are dependent upon the polymer to be hydrogenated. More particularly, the polymer is dissolved in a suitable solvent such as ethyl alcohol or acetic acid, and then the solution is contacted with a finely divided Raney nickel catalyst and allowed to react at a temperature of from about 100° to 300° C. at a pressure of from about 50 to 300 atmospheres or more. The finely divided nickel catalyst may be a nickel-on-silica, nickel-on-alumina, or nickel-on-carbon catalyst depending upon the resin to be hydrogenated. Hydrogenation is believed to reduce the double bounds in some of the phenolic units resulting in a random polymer of phenolic and cyclic alcohol units randomly interspersed in the polymer in percentages dependent upon the reaction conditions used.

A preferred polymer binder comprises units of a structure selected from the group consisting of:

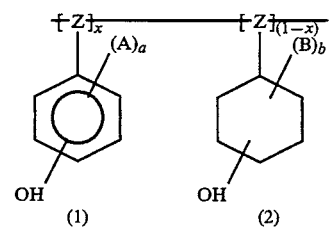

and

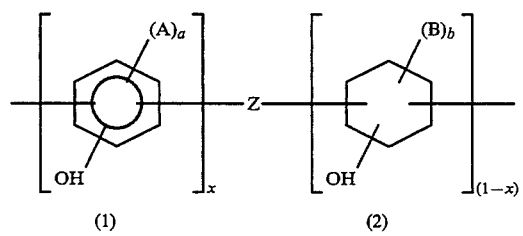

where unit (1) represents a phenolic unit and unit (2) represents a cyclic alcohol unit; (Z) is an alkylene bridge having from 1 to 3 carbon atoms; A is a substituent on the aromatic ring replacing hydrogen such as lower alkyl having from 1 to 3 carbon atoms, halo such as chloro or bromo, alkoxy having from 1 to 3 carbon atoms, hydroxyl, nitro, amino, etc.; a is a number varying from 0 to 3; B is a substituent such as hydrogen, lower alkyl having from 1 to 3 carbon atoms, halo such as chloro or bromo, alkoxy having from 1 to 3 carbon atoms, hydroxyl, nitro, amino, etc. provided that at least 3 of said B substituents are hydrogen; b is an integer varying between 6 and 10; and X is the mole fraction of the units (1) in the polymer.

In accordance with the invention, at least a portion of available hydroxyl moieties of the above polymer binder are bonded to suitable acid labile blocking groups. Suitable blocking groups in general are those that upon photocleavage provide a moiety that is more polar than hydroxyl. Further, the acid labile groups should be generally stable to any pre-exposure softbake and should not substantially interfere with photoactivation of the composition.

The percentage of cyclic alcohol units of the polymer preferably is not so high as to prevent development of an exposed film layer of the radiation sensitive composition in a polar developer solution. The polymer may have a major portion of phenolic units and a minor portion of cyclic alcohol units, i.e., less than about 50 mole percent of cyclic alcohol units. However, as it has been found that transparency of the compositions of the invention increases with the concentration of cyclic alcohol units in the polymer binder, it can be desirable to employ a polymer having a major portion of cyclic alcohol units and a minor portion of phenolic units. This can be achieved by using suitable blocking groups which upon acid catalyzed hydrolysis provide polar functional groups, rendering exposed regions highly soluble in polar developer solutions. Thus, to provide a radiation sensitive composition having high transparency, the percentage of cyclic alcohol units of the subject polymer binder is about 50 mole percent or greater; and to further enhance clarity of the composition the percentage of cyclic alcohols groups is about 60 mole percent or greater of the total polymer; and to still further enhance the transparency of the composition to activating radiation the percentage of cyclic alcohol groups may be about 70 percent or greater of the total polymer binder.

The acid labile blocking groups are generally employed in accordance with the below Scheme in which a preferred polymer binder is condensed with a compound that comprises an acid labile group (R) and a suitable leaving group (L).

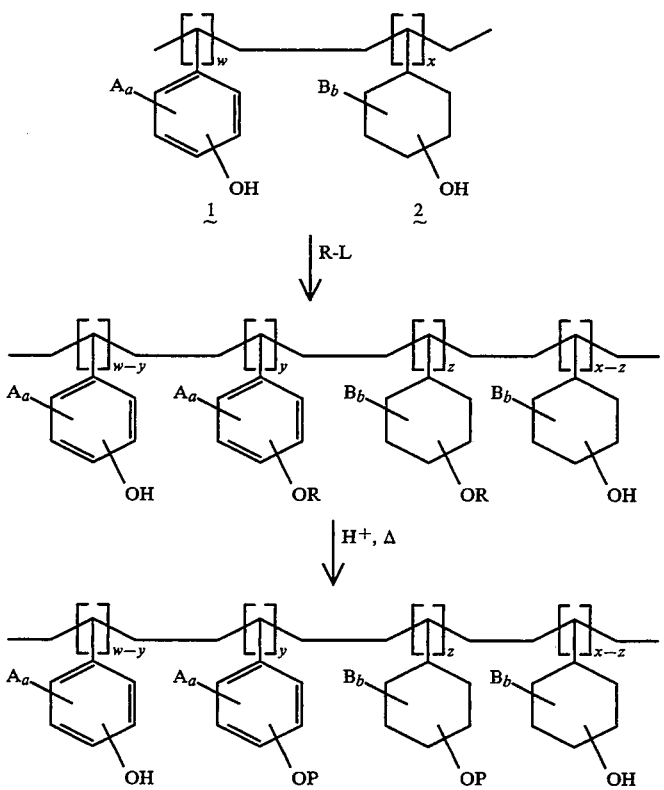

In the Scheme, unit (1) represents a phenolic unit and unit (2) represents a cyclic alcohol unit; A is a substituent on the aromatic ring replacing hydrogen such as lower alkyl having from 1 to 3 carbon atoms, halo such as chloro or bromo, alkoxy having from 1 to 3 carbon atoms, hydroxyl, nitro, amino, etc.; a is a number varying from 0 to 3; B is a substituent such as hydrogen, lower alkyl having from 1 to 3 carbon atoms, halo such as chloro or bromo, alkoxy having from 1 to 3 carbon atoms, hydroxyl, nitro, amino, etc. provided that at least 3 of said B substituents are hydrogen; b is an integer varying between 6 and 10;

R is an acid labile blocking group; L is a leaving group; P is the group provided upon acidic cleavage of the acid labile blocking group R; and W is the mole fraction of the units (1) in the copolymer; X is the mole fraction of units (2) in the copolymer; Y is the mole fraction of units (1) blocked by a group R; and Z is the mole fraction of units (2) blocked by a group R.

The acid labile group (R) is typically provided by an alkaline condensation reaction with the preformed polymer and a compound that comprises the acid labile group R and a suitable leaving group L, for instance a halogen such as bromide or chloride. For example, where R is the particularly preferred t-butoxy carbonyl methyl group, t-butyl haloacetate (e.g., t-butyl chloroacetate) is added to a solution of the polymer and a suitable base, and the mixture stirred typically with heating. A variety of bases may be employed for this condensation reaction including hydrides such as sodium hydride and alkoxides such as potassium t-butoxide. The condensation reaction is typically carried out in an organic solvent. A variety of organic solvents are suitable as is apparent to those skilled in the art. Tetrahydrofuran and dimethylformamide are preferred solvents. Suitable conditions of the condensation reaction can be determined based on the constituents used. For example, an admixture of sodium hydride, t-butylchloroacetate and a partially hydrogenated poly(vinylphenol) is stirred for about 15 to 20 hours at about 70° C.

The percent substitution of the polymer binder with the acid labile groups can be controlled by the amount of the acid labile compound that is condensed with the binder. The percent substitution of hydroxyl sites of the polymer binder can be readily ascertained by proton and $^{13}C$ NMR.

It has been found that the polymer binder can be condensed with mixtures of two or more acid labile groups to provide a mixture of acid labile groups bonded pendant to the polymer backbone. If the polymer is condensed with two or more acid labile groups, then groups R and P of the above formula will be a mixture of different groups. For example, if the subject polymer of phenolic groups and cyclic alcohol groups is first condensed with a compound of the formula R'L, and then condensed with a compound of the formula R"L, where R' and R" of said formulas are two different acid labile moieties, and L is a leaving group, the polymer will comprise a mixture of R' and R" acid labile groups.

As shown in the above Scheme, exposure to radiation produces an acid which is generated by a radiation sensitive component admixed with the polymer. Suitable photoacid generating compounds are described below and are generally well known to those skilled in the art.

It has been found that the acid labile groups add predominately to the more reactive phenolic groups, rather than the cyclic alcohol groups, of the above described polymer binder when a hydride base such as sodium hydride is employed in the condensation reaction. That is, primarily only the phenolic groups of the binder are bonded to above defined groups R and P and the cyclic alcohol groups are substantially free of acid labile groups. It is believed that acid labile groups will add to both the phenolic and cyclic alcohol groups of the binder by use of stronger bases such as butyllithium or other alkyllithium reagents.

The polymer binder shown in the above Scheme provides a radiation sensitive composition that exhibits excellent solubility differentials upon exposure with the mole fraction of blocked groups in the polymer (i.e., the sum of the values Y and Z as those values are defined above) being extremely low relative to prior systems, including values of about 0.01. Preferably, the mole fraction of blocked hydroxyl groups in the binder varies from about 0.01 to 0.5; more preferably the mole fraction of blocked hydroxyl groups varies from about 0.05 to 0.35. To alternatively state these same ranges, preferably from about 1 to 50 percent of the total hydroxyl sites of the polymer are bonded to acid labile groups, and more preferably from about 5 to 35 percent of the total hydroxyl sites of the polymer are bonded to acid labile groups. When the binder has a percentage of blocked hydroxyl blocked groups within these preferred ranges, significant shrinkage upon imaging of a coating layer of the composition of the invention is believed to be generally avoided. The mole fraction of blocked hydroxyl groups can be greater than 0.5 if desired.

Suitable acid labile groups include acetate groups such as acetate groups of the formula $-CR^1R^2C(=O)-O-R^3$, where $R^1$ and $R^2$ are each independently selected from the group of hydrogen, an electron withdrawing group such as halogen, lower alkyl having from 1 to about 10 carbon atoms, and substituted lower alkyl having from 1 to about 10 carbon atoms; and $R^3$ is substituted and unsubstituted lower alkyl having from 1 to about 10 carbon atoms, substituted and unsubstituted aryl having from 1 to about 10 carbon atoms, substituted or unsubstituted benzyl having 7 to about 13 carbon atoms. The substituents can be, for example, one or more halogen, lower alkyl, lower alkoxy, aryl or benyzl. $R^1$ and $R^2$ suitably are each hydrogen. It has been found that if $R^1$ and/or $R^2$ are halogen or other suitable electron-withdrawing group, upon acidic cleavage of the acetate group a highly polar moiety is provided along with enhanced solubility differentials between exposed and unexposed regions of a coating layer of the subject composition. The difluoro group (i.e., $R^1$ and $R^2$ both fluoro) is particularly suitable for such purposes and provides extremely high dissolution differentials between exposed and unexposed regions with only modest levels of substitution of hydroxy groups of the polymer binder. This difluoro group can be provided by alkaline condensation of the polymer with t-butyl chlorodifluoroacetate $(ClCF_2C(=O)OC(CH_3)_3)$. As noted above, $R^3$ is preferably tert-butyl (i.e., R is the tert-butyl acetate group). Acid degradation of this group liberates isobutylene to provide the polar acetic acid ether moiety pendant to the polymer backbone.

It is understood that a wide range of acid labile groups are suitable, including many of the groups described in the patents incorporated herein by reference. For example, suitable acid labile groups include oxycarbonyl groups of the formula $-C(=O)-O-R^3$, where $R^3$ is the same as defined above. Preferably, $R^3$ is tert-butyl or benzyl (i.e., R is the t-butoxy carbonyl or benzyloxy carbonyl group).

The acid generator compound used in combination with the above-described binder may be chosen from a wide variety of compounds known to form acid upon exposure to activating radiation. One suitable class of radiation sensitive compositions of this invention are compositions that use the polymer of the phenol and cyclic alcohol with acid labile groups as a binder and an o-quinone diazide sulfonic acid ester as a radiation sensitive component. The sensitizers most often used in such compositions are naphthoquinone diazide sulfonic acids such as those disclosed by Kosar, *Light Sensitive Systems*, John Wiley & Sons, 1965, pp. 343 to 352, incorporated herein by reference. These sensitizers form an acid in response to radiation of different wavelengths ranging from visible to X-ray. Thus, the sensitizer chosen will depend, in part, upon the wavelengths used for exposure. By selecting the appropriate sensitizer, the photoresists can be imaged by deep UV, E-beam, laser or any other activating radiation conventionally used for imaging photoresists. Preferred sensitizers include the 2,1,4-diazonaphthoquinone sulfonic acid esters and the 2,1,5-diazonaphthoquinone sulfonic acid esters.

Other useful acid generator include the family of nitrobenzyl esters, and the s-triazine derivatives. Suitable s-triazine acid generators are disclosed, for example, in U.S. Pat. No. 4,189,323, incorporated herein by reference.

Non-ionic photoacid generators are suitable including halogenated non-ionic, photoacid generating compounds such as, for example:

1,1-bis [p-chlorophenyl]-2,2,2-trichloroethane (DDT);
1,1-bis [p-methoxyphenyl]-2,2,2-trichloroethane;
1,2,5,6,9,10-hexabromocyclododecane;
1,10-dibromodecane;
1,1-bis[p-chloropehnyl]-2,2-dichloroethane;
4,4-dichloro-2-(trichloromethyl) benzhydrol (Kelthane);
hexachlorodimethyl sulfone;
2-chloro-6-(trichloromethyl) pyridine;
0,0-diethyl-0-(3,5,6-trichloro-2-pyridyl)phosphorothionate;
1,2,3,4,5,6-hexachlorocyclohexane;
N(1,1-bis [p-chlorophenyl]-2,2,2-trichloroethyl)acetamide;
tris [2,3-dibromopropyl]isocyanurate;
2,2-bis [p-chlorophenyl]-1,1-dichloroethylene;
tris [trichloromethyl]s-triazine;

and their isomers, analogs, homologs, and residual compounds. Suitable photoacid generators are also disclosed in European Patent Application Nos. 0164248 and 0232972, both incorporated herein by reference.

Residual compounds are intended to include closely related impurities or other modifications of the above halogenated organic compounds which result during their synthesis and may be present in miner amounts in commercial products containing a major amount of the above compounds.

Acid generators that are particularly preferred for deep UV exposure include 1,1,-bis(p-chlorophenyl)-2,2,2- trichloroethane (DDT); 1,1-bis(p-methoxyphenol)-2,2,2-trichloroethane; 1,1-bis(chlorophenyl)-2,2,2trichloroethanol; tris(1,2,3-methanesulfonyl)benzene; and tris(trichloromethyl) triazine.

Onium salts are also suitable acid generators. Onium salts, with weakly nucleophilic anions have been found to be particularly suitable. Examples of such anions are the halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryldiazonium salts and onium salts of group Va and B, Ia and B and I of the Periodic Table, for example, halonium salts, quaternary ammonium, phosphonium and arsonium salts, aromatic sulfonium salts and sulfoxonium salts or seleonium salts. Examples of suitable preferred onium salts can be found in U.S. Pat. Nos. 4,442,197; 4,603,101; and 4,624,912, all incorporated herein by reference.

A particularly suitable group of acid generating compounds useful in the compositions of the invention are the iodonium salts. A preferred group of iodonium salts are those resulting from the condensation of aryl iodosotosylates and aryl ketones as disclosed, for example, in U.S. Pat. No. 4,683,317, incorporated herein by reference.

Another group of suitable acid generators is the family of sulfonated esters including sulfonyloxy ketones. Suitable sulfonated esters have been reported in *J. of Photopolymer Science and Technology*, vol. 4, no. 3, 337–340 (1991), incorporated herein by reference, including benzoin tosylate, t-butylphenyl alpha-(p-toluenesulfonyloxy)-acetate, and t-butyl alpha-(p-toluenesulfonyloxy)-acetate.

Dissolution inhibitor compounds may be added to the radiation sensitive compositions of the invention to further control dissolution of an exposed coating layer of the composition. Suitable dissolution inhibiting compounds include, for example, t-butyloxycarbonato-bisphenol-A and t-butylacetoxy-bis-phenol-A. The dissolution inhibiting compounds may be suitably in a concentration of about 5 to 10 weight percent of total solids of a photoresist formulation.

In addition to the components described above, other conventional additives known to the art may be added to the radiation sensitive compositions of this invention. Such additives typically include dyes, adhesion promoting agents, solubility modifiers, other resins for specific purposes, materials to improve chemical resistance, flexibility, etch resistance, electrical properties, coating characteristics, exposure speed, development and resolution characteristics, etc.

As noted, use of a polymer of a phenol and a cyclic alcohol as a resin binder for a radiation sensitive composition in accordance with the invention improves optical properties because the binder contains fewer conjugated bonds, it being known that such bonds absorb at activating radiation, especially at wavelengths below 350 nm. In addition, it is believed that optical properties are improved due to elimination of quinone type impurities in said resins when hydrogenation is the means selected to form the polymer binder.

Use of the polymer binder containing phenol and the cyclic alcohol and having acid labile moieties provides another advantage. Following exposure and development of a photoresist prepared in accordance with the invention, the relief image generated is of improved resolution and possesses an improved profile. The relief image possesses substantially vertical side walls and is capable of reproducing submicron features.

The compositions of the invention are generally prepared following prior art procedures for the preparation of photoresists and other photocurable compositions with the exception that the polymer binder with acid labile groups as described above is substituted for the conventional resins used in the formulation of such compositions. The compositions of the invention are formulated as a coating composition by dissolving the components of the composition in a suitable solvent such as, for example, a glycol ether such as 2-methoxyethyl ether (diglyme), ethylene glycol monomethyl ether, ethylene glycol monomethyl ether, propylene glycol monomethyl ether; a Cellosolve ester such as methyl Cellosolve Acetate; an aromatic hydrocarbon such as toluene or xylene; or a ketone such as methylethyl ketone. Typically, the solids content of the composition varies between about 5 and 35 percent by weight of the total weight of the radiation sensitive composition.

The compositions of the invention are used in accordance with generally known procedures though exposure and development conditions may vary as a consequence of improved photospeed and altered solubility in developer. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The composition is applied to substrates conventionally used in processes involving coating with photoresists. For example, the composition may be applied over silicon or silicon dioxide wafers for the production of microprocessors and other integrated circuit components. Aluminum—aluminum oxide and silicon nitride wafers can also be coated with the photocurable compositions of the invention. Another suitable use of the composition of the invention is as a planarizing layer or for formation of multiple layers in accordance with art recognized procedures.

Following coating of the resist onto a surface, it is dried by heating to remove the solvent until preferably the resist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 10 to 300 $mJ/cm^2$, dependent upon the exposure tool.

A wide range of activating radiation can be suitably employed to expose the photoacid-generating compositions of the invention, including radiation of wavelengths anywhere in the range of from about 248 to 700 nm. As noted above, the compositions of the invention are especially suitable for deep UV exposure. The spectral response of the compositions of invention can be expanded by the addition of suitable radiation sensitizer compounds to a composition.

Following exposure, the film layer of the composition is preferably baked at temperatures ranging from about 70° C. to about 140° C. Thereafter, the film is developed. The exposed resist film is rendered positive working by employing a polar developer, preferably an aqueous based developer such as an inorganic alkali exemplified by sodium hydroxide, potassium hydroxide, sodium carbonate, sodium bicarbonate, sodium silicate, sodium metasilicate, or the like. Alternatively, organic developers can be used such as choline based solutions; quaternary ammonium hydroxide solutions such as a tetra-alkyl ammonium hydroxide solution; various amine solutions such as ethyl amine, n-propyl amine, diethyl amine, di-n-propyl amine, triethyl amine or, methyldiethyl amine; alcohol amines such as diethanol amine or triethanol amine; cyclic amines such as pyrrole, pyridine, etc. The exposed resist film is rendered negative working by employing suitable organic developers such as methylene chloride or hexanes, or mixtures thereof. In general, development is in accordance with art recognized procedures.

The developed substrate may then be selectively processed on those substrates areas bared of resist, for example chemically etching or plating substrate areas bared of resist in accordance with procedures known in the art. For the manufacture of microelectronic substrates, for example the manufacture of silicon dioxide wafers, suitable etchants include a plasma gas etch and a hydrofluoric acid etching solution. The compositions of the invention are highly resistant to such etchants thereby enabling manufacture of highly resolved features, including lines with submicron widths. After such processing, resist may be removed from the processed substrate using known stripping procedures.

The following examples are illustrative of the invention.

GENERAL COMMENTS

In the examples, the hydrogenated poly(vinylphenol) resins were PHM-C grade and obtained from Maruzen Oil of Tokyo, Japan. The degree of hydrogenation of these poly(p-vinyl phenols) is expressed as % of aromatic double bonds converted to single bonds, or equivalently as % hydroxyphenyl groups converted to hydroxycyclohexyl groups. All temperatures throughout this disclosure are in degrees Celsius.

EXAMPLE 1

Preparation of t-Butylacetate-modified Poly ( 4-vinylphenol ).

The title compound was prepared as follows. 20 g of poly ( 4-vinylphenol ) at 10% hydrogenation was dissolved in 200 mL of dry dimethylformamide under nitrogen. To this solution was added 0.80 g of NaH (95%) and the reaction mixture was allowed to stir for 30 minutes. 5.4 g of tert-butyl chloroacetate was then added dropwise to the solution and the mixture was heated at 70° C. for 18 hours. After cooling and filtering the product was isolated by adding the solution to 3 L of water. The precipitate was collected by filtration, re-slurried in water and re-filtered. The resulting polymer was then dried at 50° C. under vacuum for 24 hours. The degree of substitution (about 20 mole percent of available hydroxyl groups) was confirmed by proton and carbon-13 NMR.

EXAMPLE 2

Preparation of t-Butylacetate-modified Hydrogenated m-Cresol Novolak.

The title compound was prepared by procedures similar to those described in Example 1. Thus, a 30 g sample of hydrogenated (20%) m-cresol novolak (catalytically reduced with Raney nickel under 100 arm) was treated with 3.0 g of NaH and 18.8 g of tert-butyl chloroacetate. The mixture was heated at 70° C. for 12 hours. The reaction mixture was cooled and the product isolated by aqueous quench, washed and the final product dried at 60° C. for 24 hours. The degree of substitution (about 15 percent of available hydroxyl groups) was confirmed by proton and carbon-13 NMR.

EXAMPLE 3

This Example illustrates deblocking of the t-Butylacetate-modified Poly(vinylphenol).

To a 22 weight percent solution of the t-butylacetate-modified poly(vinylphenol) prepared in Example 1, in 3:1 (v/v) propylene glycol monomethylether acetate/anisole mixture was added 5 weight percent (based on weight of the polymer) of tris(mesyl)pyrogallol. The solution was spin coated onto silicon wafers (HMDS primed) at 3000 rpm (30 seconds) to form a 1 $\mu$m film. The films were then softbaked at 90° C. for 60 seconds on a vacuum hot plate. The films exhibited a dissolution rate of 170 A/s in 0.21 N tetramethylammonium hydroxide (TMAH) developer at 25° C. After exposing the films to 125 mJ/cm$^2$ of UV radiation (260 nm) and baking at 110° C. (hot plate, 60 seconds) a dissolution rate of 10,600 A/s was obtained under the same development conditions. The deblocking of the acid labile groups was confirmed by IR spectroscopy.

EXAMPLE 4

This Example illustrates deblocking of the t-Butylacetate-modified Hydrogenated m-Cresol Novolak.

To a 25 weight percent diglyme solution of the t-butylacetate-modified hydogenated m-cresol novolak prepared in Example 2 was added 5% (by weight of polymer) of triphenylsulfonium hexafluoroarsenate. The solution was spin coated onto silicon wafers primed with hexamethyldisilazane (HMDS) at 3000 rpm (30 seconds). After softbaking for 60 seconds at 90° C on a hot plate the wafers were exposed to 125 mJ/cm$^2$ of UV (260 nm) radiation and post-exposure baked at 130° C. for 60 seconds. The dissolution rate before exposure was zero and after deblocking the rate was greater than 20,000 A/s in a 0.21 N tetramethylammonium hydroxide (TMAH) aqueous developer solution.

EXAMPLE 5

A photoresist solution comprised of 23 weight percent of the t-butylacetate-modified poly(4-vinylphenol) prepared in Example 1, 2.3 weight percent of tris(methanesulfonyl)pyrogallol, and about 75 weight percent diglyme was spin coated onto HMDS primed silicon wafers (4,000 rpm, 30 seconds) . After baking at 90° C. for 60 seconds (hot plate) 0.9 micron films were obtained. An array of 4×8 mm square regions were exposed over a range of energies from 7.2 to 115.2 mJ in steps of 3.6 mJ on a GCA AWIS Excimer Laser Stepper at 248 nm. The exposed wafers were post-exposure baked at 90° C. for 60 seconds and developed by single puddle for 60 seconds in 0.14N TMAH aqueous developer solution. Scanning electron microscopy analysis revealed that 0.5 μm lines having essentially vertical sidewalls were printed.

EXAMPLE 6

Preparation of a positive resist composition sensitized with bisphenol-A and suitable for deep UV exposure.

To a 25 weight solution of diglyme and the t-butylacetate-modified poly(4-vinylphenol) prepared in Example 1 was added 10% of tris(mesyl)pyrogallol and 10% bisphenol-A (based on polymer weight). After filtration this resist solution was coated to one micron onto silicon substrates on a SVG 86 Wafertrac (3,000 rpm, 60 seconds) and softbaked for 60 seconds at 90° C. The wafers were exposed on an HTG DUV exposure unit, post-exposure baked at 90° C. for 60 seconds (hotplate), and developed in 0.14N TMAH. Values for contrast and $E_0$ were then calculated from plots of normalized thickness versus log exposure dose. The values for the example described above were $E_O=21$ mJ/cm$^2$ and a gamma of 20 while those of a resist without any sensitizer were 40 mJ/cm$^2$ and 5.9 respectively.

EXAMPLE 7

Preparation of a dual blocked polymer.

The t-butylacetate-modified poly(4-vinylphenol) prepared in Example 1 was dissolved in 400 mL of tetrahydrofuran while purging with nitrogen. To this solution was added 1.19 g of potassium t-butoxide and the reaction was stirred for 15 minutes. A solution of 2.32 g of di-t-butyl dicarbonate in 20 mL of tetrahydrofuran was then added dropwise and the mixture was allowed to stir for 12 hours at room temperature. The resulting polymer was precipitated into water, redissolved in acetone, and re-precipitated. The product was then dried at 60° C. for 18 hours under vacuum. This reaction yielded a polymer containing 10% t-butoxycarbonyloxy groups.

EXAMPLE 8

A dual blocked positive resist suitable for deep UV exposure.

A resist composition comprised of 25 weight percent of the dual blocked polymer prepared in Example 7 and 10 weight percent of tris(mesyl)pyrogallol dissolved in diglyme was treated as described in the Example 6 with the exception that the post-exposure bake temperature was 100° C. The contrast curve yielded an $E_0$ of 33 mJ/cm$^2$ and a gamma value of 6.8.

The foregoing description of the present invention is merely illustrative thereof, and it is understood that variations and modifications can be effected without departing from the spirit or scope of the invention as set forth in the following claims.

What is claimed is:

1. A photoresist composition comprising an admixture of a resin binder and a radiation sensitive component which generates acid upon exposure to activating radiation, the resin binder comprising a polymer having phenolic units and non-aromatic cyclic alcohol units, at least a portion of the hydroxyl groups of the polymer being bonded to acetate acid labile groups, and the radiation sensitive component being present in an amount capable of generating a latent image by exposure of a coating of the composition to activating radiation.

2. The composition of claim 1 further comprising one or more dissolution inhibitor compounds.

3. The composition of claim 2 where the dissolution inhibitor compounds comprise one or more compounds selected from the group consisting of t-butyloxycarbonato-bis-phenol-A and t-butylacetoxy-bis-phenol-A.

4. The composition of claim 1 where the acetate groups have the formula —CR$^1$R$^2$C(=O)—O—R$^3$ wherein R$^1$ and R$^2$ are independently selected from the group consisting of hydrogen, an electron withdrawing group, lower alkyl having from 1 to about 10 carbon atoms, and substituted lower alkyl having from 1 to about 10 carbon atoms; R$^3$ is selected from the group consisting of lower alkyl having from 1 to about 10 carbon atoms, substituted lower alkyl having from 1 to about 10 carbon atoms, aryl having from 6 to about 10 carbon atoms, substituted aryl having from 6 to about 10 carbon atoms, and benzyl having from 7 to 11 carbon atoms.

5. The composition of claim 4 where one or both of R$^1$ and R$^2$ are a halogen.

6. The composition of claim 1 where the polymer is a selected from the group consisting of a partially hydrogenated novolak and a partially hydrogenated poly(vinylphenol).

7. The composition of claim 1 where the concentration of non-aromatic cyclic alcohol units is about 50 mole percent or greater of the total of the polymer.

8. The composition of claim 1 where the concentration of non-aromatic cyclic alcohol units is about 60 mole percent or greater of the total of the polymer.

9. The composition of claim 1 where between about 5 and 35 percent of the total hydroxyl units of the polymer binder are bonded to acid labile groups.

10. The composition of claim 1 where acid generator compound is selected from the group consisting of o-quinone diazide sulfonic acid esters, non-ionic halogenated photogenerator compounds, onium salts, and sulfonated esters.

11. A process for forming a relief image comprising:
(a) applying a coating layer of the photoresist composition of claim 1 on a substrate;
(b) exposing and developing the photoresist coating layer on the substrate to yield a relief image.

12. A photoresist composition comprising an admixture of a resin binder and a radiation sensitive component which generates acid upon exposure to activating radiation, the resin binder comprising a polymer having phenolic units and non-aromatic cyclic alcohol units, at least a portion of the hydroxyl groups of the polymer being bonded to acid labile groups, and the radiation sensitive component being present in an amount capable generating a latent image by exposure of a coating of the composition to activating radiation.

13. The composition of claim 12 further comprising one or more dissolution inhibitor compounds.

14. The composition of claim 13 where the dissolution inhibtor compounds comprise one or more compounds selected from the group consisting of t-butyloxycarbonato-bis-phenol-A and t-butylacetoxy-bis-phenol-A.

15. The composition of claim 12 where the polymer is a selected from the group consisting of a partially hydrogenated novolak and a partially hydrogenated poly(vinylphenol).

16. The composition of claim 12 where the concentration of non-aromatic cyclic alcohol units is about 50 mole percent or greater of the total of the polymer.

17. The composition of claim 12 where the concentration of non-aromatic cyclic alcohol units is about 60 mole percent or greater of the total of the polymer.

18. The composition of claim 12 where acid generator compound is selected from the group consisting of o-quinone diazide sulfonic acid esters, non-ionic halogenated photogenerator compounds, onium salts, and sulfonated esters.

19. A process for forming a relief image comprising:
 (a) applying a coating layer of the photoresist composition of claim 12 on a substrate;
 (b) exposing and developing the photoresist coating layer on the substrate to yield a relief image.

* * * * *